(12) United States Patent
Carinci et al.

(10) Patent No.: US 10,386,436 B2
(45) Date of Patent: Aug. 20, 2019

(54) METHOD AND APPARATUS FOR ACCELERATED SIMULTANEOUS MULTISLICE MAGNETIC RESONANCE DATA ACQUISITION

(71) Applicant: Siemens Healthcare GmbH, Erlangen (DE)

(72) Inventors: Flavio Carinci, Erlangen (DE);
Dominik Paul, Bubenreuth (DE);
Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 44 days.

(21) Appl. No.: 15/710,078

(22) Filed: Sep. 20, 2017

(65) Prior Publication Data
US 2018/0081016 A1    Mar. 22, 2018

(30) Foreign Application Priority Data

Sep. 20, 2016  (DE) .................... 10 2016 217 995
Sep. 21, 2016  (DE) .................... 10 2016 218 125

(51) Int. Cl.
*G01R 33/36*    (2006.01)
*G01R 33/54*    (2006.01)
(Continued)

(52) U.S. Cl.
CPC ......... *G01R 33/5611* (2013.01); *G01R 33/36* (2013.01); *G01R 33/4835* (2013.01); *G01R 33/543* (2013.01); *G01R 33/5613* (2013.01)

(58) Field of Classification Search
CPC ............ G01R 33/5611; G01R 33/4835; G01R 33/36; G01R 33/543; G01R 33/5613
(Continued)

(56) References Cited

U.S. PATENT DOCUMENTS

| 4,893,081 A | 1/1990 | Zur |
| 7,755,356 B1* | 7/2010 | Shenoy .............. G01R 33/5617 |
| | | 324/307 |
| 2013/0342206 A1 | 12/2013 | Ugurbil |

OTHER PUBLICATIONS

Van Uijen, et al.: "Driven-Equilibrium Radiofrequency Pulses in NMR Imaging", Magnetic Resonance in Medicine, vol. 1, pp. 502-507; (1984).
(Continued)

*Primary Examiner* — Farhana A Hoque
(74) *Attorney, Agent, or Firm* — Schiff Hardin LLP

(57) ABSTRACT

In a method and apparatus for generating magnetic resonance (MR) measurement data of an object, (a) a multiband RF excitation pulse is radiated into the object to simultaneously selectively excite at least two slices, which do not overlap, in the object, and (b) echo signals generated are read out with at least two reception coils and are stored in a measurement data record, and (c) after reading out a last echo signal that follows from the multiband RF excitation pulse, a driven equilibrium module is radiated that includes at least one further multiband RF pulse. Steps (a) to (c) are repeated with different position encoding and/or while exciting different slices, until all desired measurement data are stored in the measurement data record. The measurement data contained in the measurement data record are separated into slice-specific measurement data records on the basis of coil sensitivity data of the reception coils used for read-out purposes.

15 Claims, 4 Drawing Sheets

(51) Int. Cl.
*G01R 33/483* (2006.01)
*G01R 33/561* (2006.01)

(58) Field of Classification Search
USPC .................................................. 324/307, 309
See application file for complete search history.

(56) References Cited

OTHER PUBLICATIONS

Breuer et. al.: "Controlled Aliasing in Parallel Imaging Results in Higher Acceleration (CAIPIRINHA) for Multi-Slice Imaging", in: Magnetic Resonance in Medicine, vol. 53, No. 3, pp. 684-691; (2005).

Hennig, et al: "Multiecho Sequences with Variable Refocusing Flip Angles: Optimization of Signal Behavior Using Smooth Transitions between Pseudo Steady States (TRAPS)"; Proc. Intl. Soc. Mag. Reson. Med.; vol. 10; p. 2356; (2002).

Alsop: "The sensitivity of low flip angle RARE imaging," Magn. Reson. Med, vol. 37, pp. 176-184. (1997).

Setsompop et.al.: "Blipped-Controlled Aliasing in Parallel Imaging for Simultaneous Multislice Echo Planar Imaging with Reduced g-Factor Penalty", in: Magnetic Resonance in Medicine, vol. 67, pp: 1210-1224, (2012).

German Action dated Jun. 14, 2019 for Application No. 10 2016 218 125.4.

\* cited by examiner

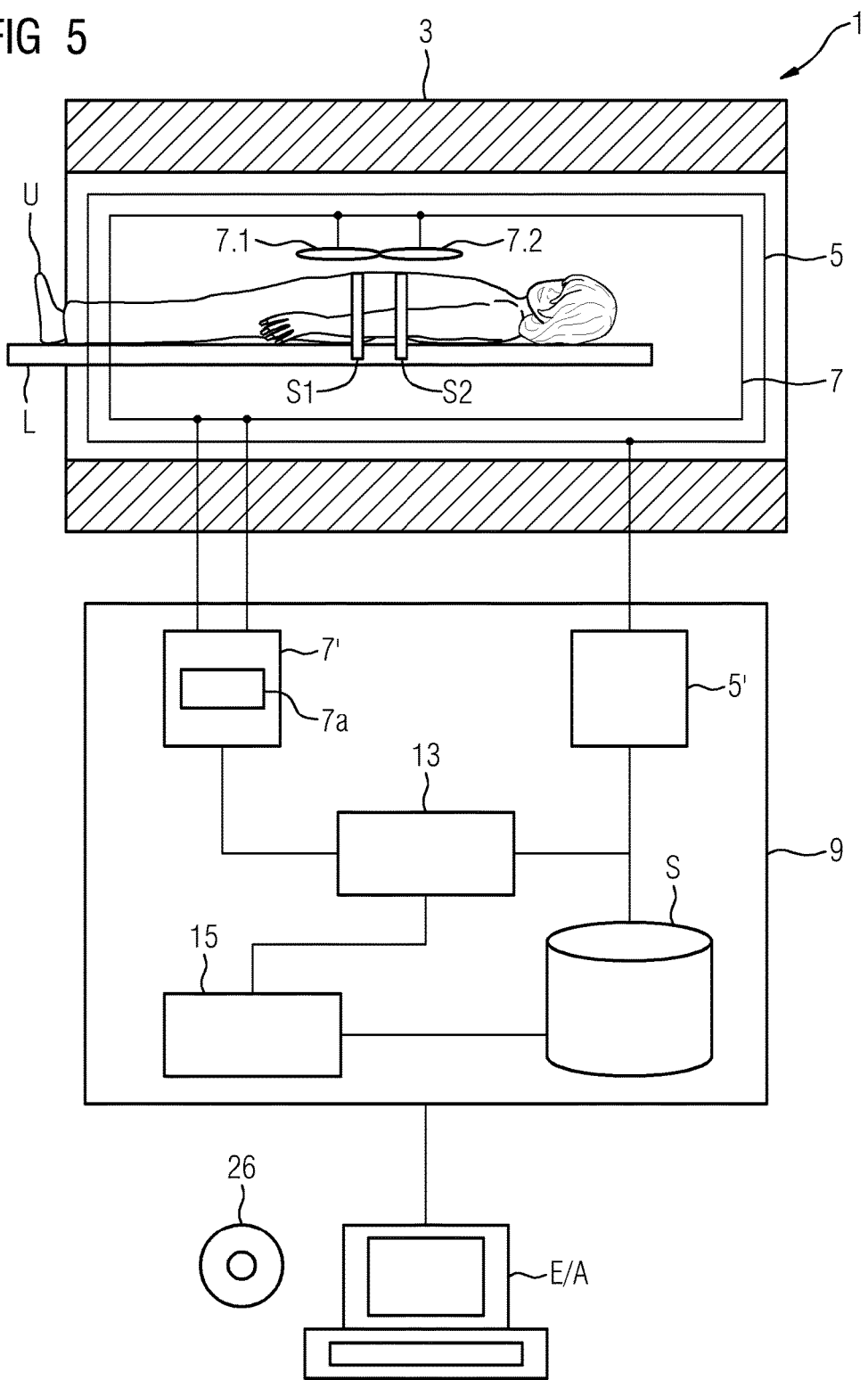

METHOD AND APPARATUS FOR ACCELERATED SIMULTANEOUS MULTISLICE MAGNETIC RESONANCE DATA ACQUISITION

BACKGROUND OF THE INVENTION

Field of the Invention

The invention concerns simultaneous multislice magnetic resonance techniques.

Description of the Prior Art

Magnetic resonance (MR) is a known modality that can be used to generate images of the inside of an examination object. Simply described, the examination object is moved into a magnetic resonance scanner in which the object is subjected to s strong static, homogeneous constant basic magnetic field, also called a $B_0$ field, with field strengths of 0.2 Tesla to 7 Tesla and more, such that nuclear spins in the object are oriented along the constant magnetic field. To trigger nuclear spin resonances, radio-frequency (RF) excitation pulses are radiated into the examination object, the triggered MR signals are measured as so-called k-space data, and on the basis thereof MR images are reconstructed or spectroscopy data are determined. For spatially encoding the measurement data, rapidly switched magnetic gradient fields are overlaid on the constant magnetic field. The recorded measurement data are digitized and stored in the form of complex numerical values in a k-space matrix. An associated MR image can be reconstructed from the populated k-space matrix, for example by a multidimensional Fourier transform.

The most frequently used method for generating echo signals after exciting the nuclear spins is what is known as the spin echo (SE) method. In the simplest case, by radiating at least one RF refocusing pulse after the RF excitation pulse has been radiated, the transverse magnetization of the nuclear spins is "turned," so dephased magnetization is rephased again and thus a signal known as a spin echo SE, is generated after a time TE referred to as echo time that follows on from the RF excitation pulse.

The excitation and the measurement of the generated echo signals are repeated after a repetition time TR (e.g. by switching various gradients for spatial encoding) until a number of echo signals has been measured and stored in k-space, in order to be able to map the desired region examination object that is to be imaged.

Among the SE sequences, the TSE sequences (TSE: "Turbo Spin Echo"), which are also known by the names FSE ("Fast Spin Echo") and RARE ("Rapid Acquisition with Refocused Echoes") sequences, are common in clinical applications. The advantage of the TSE sequences compared with the "simple" SE sequence is that a number of refocusing pulses are radiated after an RF excitation pulse. As a result, a number of spin echo signals also generated after an excitation. As a result, the data acquisition is accelerated because fewer repetitions of the sequence with different position encoding are required in order to measure all desired data. With TSE sequences, the measurement time for the entire k-space is thus reduced compared with conventional SE methods, according to the number of echo signals that are refocused and acquired after an excitation; this is known as the "turbo factor".

However since 180° pulses are conventionally used for the refocusing pulses, TSE sequences can generate a high SAR load ("specific absorption rate") load. It is also possible to use smaller flip angles for the refocusing pulses without significantly reducing the signal intensity, so a "pseudo steady state" is generated. This is described e.g. in the article by Alsop "The Sensitivity of Low Angle RARE Imaging", Magnetic Resonance in Medicine, 37, 1997, pages 176-184. How the flip angles can be selectively manipulated is described by Hennig et al. in "Multiecho Sequences with Variable Refocusing Flip Angles: Optimization of Signal Behavior Using Smooth Transitions between Pseudo Steady States (TRAPS)"; Proc. Intl. Soc. Mag. Reson. Med. 10, 2002, page 2356.

A further option for reducing the time required for a complete measurement is the use of driven equilibrium methods. With driven equilibrium methods, after an echo signal has been acquired, in particular the last echo signal within a repetition, at least one further RF pulse is radiated into the examination object, which serves to rapidly reestablish the longitudinal magnetization prior to the next excitation (T1 relaxation), and thus permits shorter repetition times TR without negatively affecting the contrast.

Driven equilibrium methods are described for instance in the article by van Uijen et al., "Driven-Equilibrium Radiofrequency Pulses in NMR Imaging", Magnetic Resonance in Medicine 1, 1984, pages 502-507 and in U.S. Pat. No. 4,893,081.

The desire for ever-quicker MR recordings in a clinical environment is currently leading to widespread development and use of methods in which a number of images are recorded simultaneously. These methods can generally be characterized by the way in which transverse magnetization of at least two slices is selectively used at the same time for the imaging process ("multislice imaging", "slice multiplexing") at least during part of the measurement. In contrast, with established "multislice imaging", the signal of at least two slices is recorded alternately i.e. completely independently of one another with a correspondingly longer measurement time.

Known methods here are, for instance, Hadamard encoding, methods with simultaneous echo refocusing, methods with broadband data acquisition, and methods that use parallel imaging in the slice direction. The latter methods include the CAIPIRINHA technique, such as described by Breuer et al. in "Controlled Aliasing in Parallel Imaging Results in Higher Acceleration (CAIPIRINHA) for Multi-Slice Imaging", Magnetic Resonance in Medicine 53, 2005, pages 684-691, and the blipped CAIPIRINHA technique, as described by Setsompop et al. in "Blipped-Controlled Aliasing in Parallel Imaging for Simultaneous Multislice Echo Planar Imaging With Reduced g-Factor Penalty", Magnetic Resonance in Medicine 67, 2012, pages 1210-1224.

With slice multiplexing methods of this type, a type of excitation pulse known as a multiband RF pulse is used, in order to excite nuclear spins in two or more slices at the same time, or otherwise to manipulate them, e.g. to refocus or saturate them. Such a multiband RF pulse can be a multiplexed output of individual RF pulses, which are used to act on the individual slices to be manipulated at the same time. In order to be able to separate the resulting signals of the various slices, a different phase is applied in each case to the individual RF pulses prior to the multiplexing for instance, such as by adding a linear phase increase, as a result of which the slices in the spatial domain are displaced with respect to one another. By multiplexing, a baseband-modulated multiband RF pulse is obtained by adding the pulse shapes of the individual RF pulses, for instance.

As described in the article by Setsompop et al. cited above, g-factor disadvantages can be reduced by displacements between the slices, such as by gradient blips being used or the phases of the individual RF pulses being modulated accordingly. As likewise described in the cited article by Setsompop et al. as well as in the cited article by Breuer et al., the signals of the slices that are excited at the same time, or are otherwise manipulated, can be combined as signals from just one slice, in order then to be separated in post-processing by a parallel reconstruction method, e.g. a (slice) GRAPPA Method (GRAPPA: "GeneRalized Autocalibrating Partial Parallel Acquisition") or a SENSE method (SENSE: "SENSitivity Encoding").

SUMMARY OF THE INVENTION

An object of the present invention is to further accelerate slice multiplexing methods, without negatively affecting the quality of the measurement data obtained.

An inventive method for generating measurement data of an examination object by means of magnetic resonance technique has the following steps.

a) radiating a multiband RF excitation pulse into the examination object for simultaneously selectively exciting at least two slices, which do not overlap, in the examination object, b) reading out generated echo signals with at least two reception coils and storing the read-out echo signals in a measurement data record, c) after reading out a last echo signal which follows on from the multiband RF excitation pulse, irradiating a driven equilibrium module which comprises at least one further multiband RF pulse, d) repeating the steps a) to c) with different position encoding and/or while exciting different slices until all desired measurement data are stored in the measurement data record, e) separating the measurement data contained in the measurement data record into slice-specific measurement data records based on coil sensitivity data of the reception coils used for read-out purposes.

The inventive use of driven equilibrium modules allows the repetition time TR also to be shortened in slice multiplexing methods, which overall further accelerates the measurement without negatively affecting the quality of the measurement data obtained.

An inventive magnetic resonance apparatus has a data acquisition scanner with a basic field magnet, a gradient coil arrangement, a radio-frequency (RF) antenna, and a control computer designed to implement the inventive method. The computer has an RF transmit/receive controller with a multiband RF pulse unit.

The present invention also encompasses a non-transitory, computer-readable data storage medium encoded with programming instructions (program code) that when the storage medium is loaded into a computer or a computer system of a magnetic resonance apparatus, cause the computer or computer system to operate the magnetic resonance apparatus in order to implement any or all of the embodiments of the method according to the invention, as described above.

The advantages and details described above for the method apply as well to the magnetic resonance apparatus, and the electronically readable data carrier.

BRIEF DESCRIPTION OF THE DRAWINGS

FIG. 5 schematically illustrates an inventive magnetic resonance system.

DESCRIPTION OF THE PREFERRED EMBODIMENTS

Figure 1:
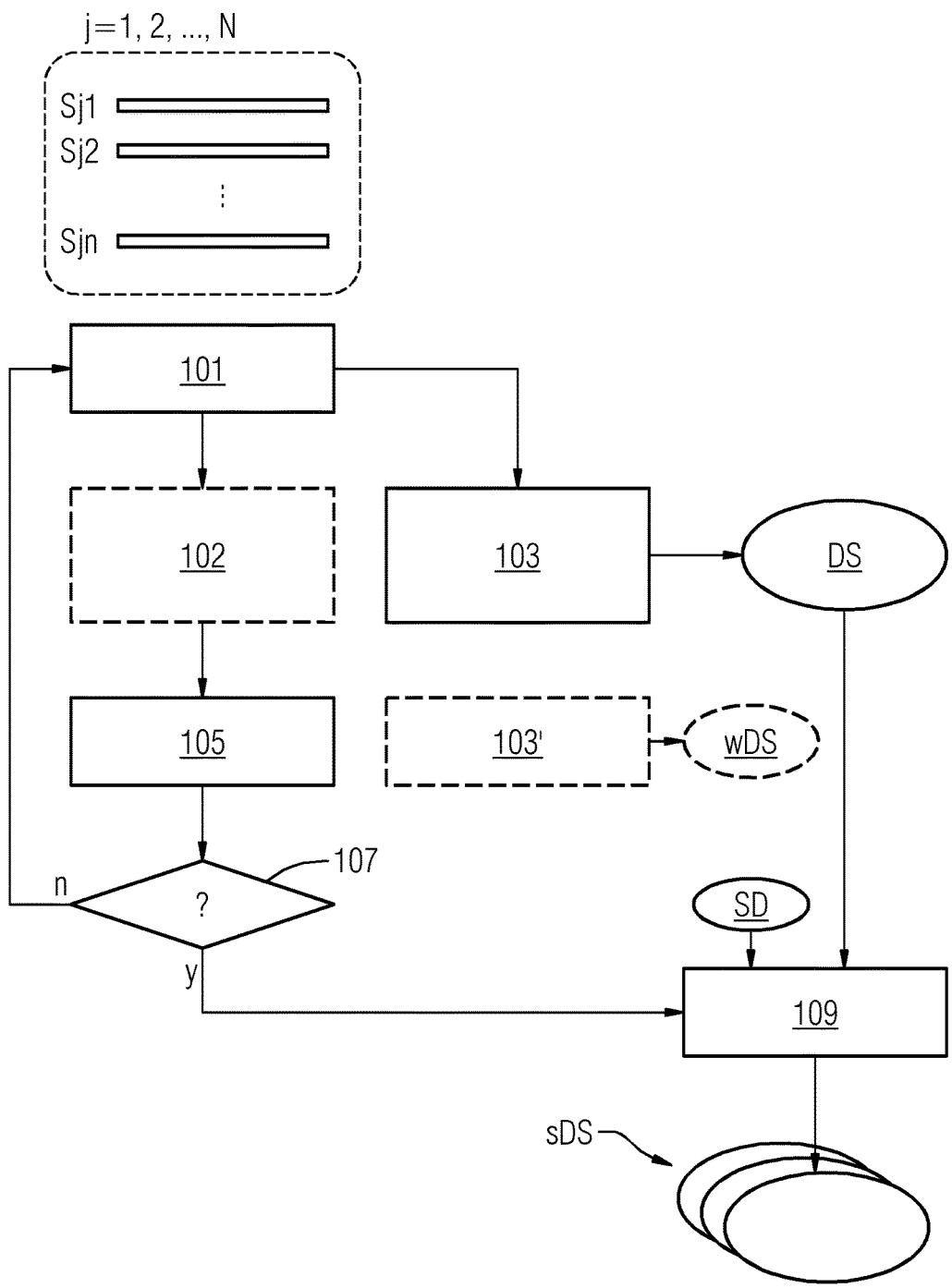
FIG. 1 is a schematic flowchart of the inventive method.

FIG. 1 is a flowchart of an inventive method for generating measurement data of an examination object. In such cases a multiband RF excitation pulse is radiated into an examination object, in order there to selectively excite (block 101) simultaneously at least two slices, which do not overlap.

In such cases the multiband RF excitation pulse can act on n slices Sji (i=1, 2, . . . , n) from one, e.g. the j'th set (j=1, 2, . . . , N) of N sets of n slices to be manipulated simultaneously, wherein n and N are whole numbers.

Echo signals, which are read out by at least two reception coils, and are stored in a measurement data record DS, (block 103) are generated by the excitation by the multiband RF excitation pulse. Here the reception coils used to read out the echo signals do not need to be purely reception coils, but can be transmit/reception coils.

After the multiband RF excitation pulse, at least one multiband RF refocusing pulse can also be radiated, which refocuses the spins in the at least two excited slices and thus generates spin echo signals (block 102) which are read out and stored in block 103.

After reading out a last echo signal that follows from the multiband RF excitation pulse and is to be read out, a driven equilibrium module is radiated, which includes at least one further multiband RF pulse (block 105). The driven equilibrium module ensures that the longitudinal magnetization of the excited spins is reestablished more quickly after the echo signals have been read out and prior to a next excitation and thus accelerates the T1 relaxation.

Echo signals generated during or after the driven equilibrium module can also be read out and stored (block 103'). The measurement signals read out in this way during the driven equilibrium module can be stored in a further data record wDS. The further data record wDS can be used e.g. to optimize the gradients used in the pulse sequence, such as is described, for instance, in U.S. Pat. No. 4,893,081 cited above.

If not all desired measurement data have been yet read out and stored in the measurement data record DS ("n" with query 107), the blocks 101 to 105 are repeated with different position encoding and/or while exciting different slices $S_{ji}$ until all desired measurement data are stored in the measurement data record ("y" with query 107).

When If all desired measurement data have been read out and stored in the measurement data record DS, the measurement data contained in the measurement data record DS are separated into slice-specific measurement data records sDS on the basis of coil sensitivity data SD of the reception coils used for read-out purposes (block 109). To this end, parallel reconstruction techniques such as are known e.g. from GRAPPA ("GeneRalized Autocalibrating Partial Parallel Acquisition") or from SENSE ("SENSitivity Encoding") methods, can be used. Parallel reconstruction methods of this type are also described in the articles by Breuer and Setsompop cited above. A slice-specific measurement data record now contains only measurement data of the affected slice, so that the data can be processed and, if applicable, converted into image data and displayed as an image.

Figure 2:
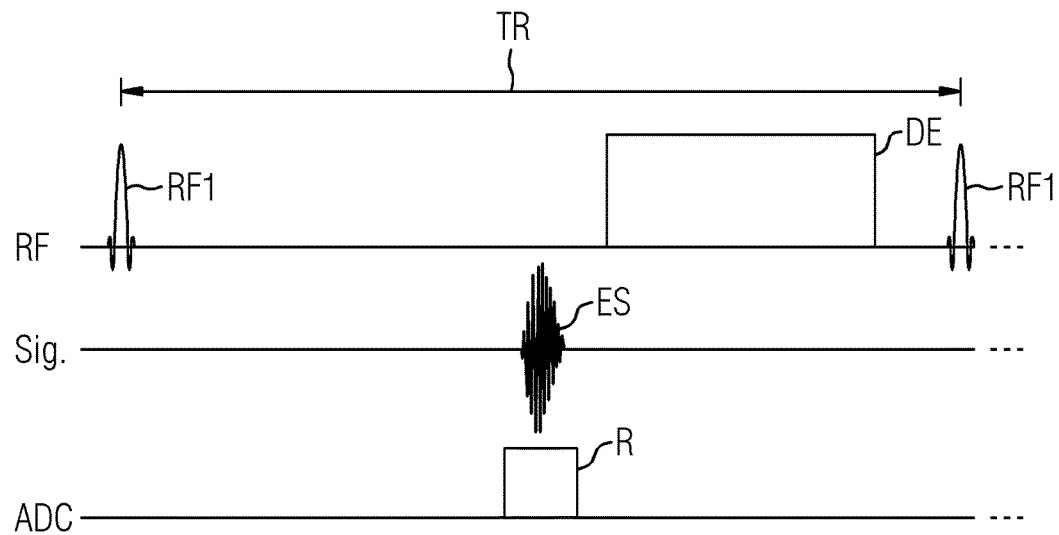
FIG. 2 schematically illustrates a pulse sequence diagram, as can be used for the inventive method.

A schematic pulse sequence diagram, such as can be used for the inventive method, is shown in FIG. 2. An echo signal ES, which is read out in a read-out time R, is generated by a multiband RF excitation pulse RF1 e.g. by converting an analog signal from the reception coils into a digital signal. A driven equilibrium module DE, which is indicated in FIG. 2 only as a block, is radiated after the last echo signal ES following on from a multiband RF excitation pulse RF1. Examples of inventive driven equilibrium modules are described below with reference to FIGS. 3 and 4.

The pulse sequence plan is repeated after a repetition time TR, wherein generally other gradients are switched for position encoding of the echo signals and/or also other slice selection gradients are switched for exciting different slices. In principle the gradients to be switched are known, which is why, for clarity, they are not shown.

Figure 3:
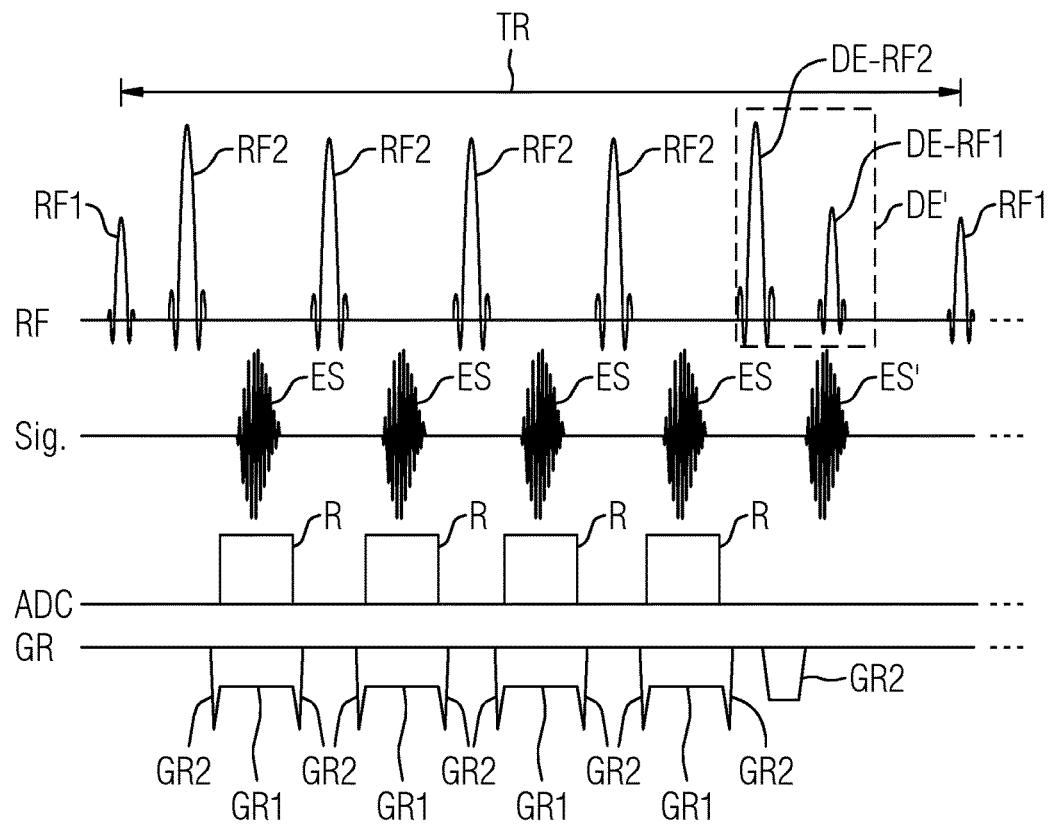
FIG. 3 shows a further schematic pulse sequence diagram, as can be used for the inventive method.

A further pulse sequence diagram, such as can be used for an inventive method, is shown in FIG. 3. In principle the same components are provided with the same reference numbers in all figures.

In the example shown in FIG. 3, a series of at least two multiband RF refocusing pulses RF2 for refocusing spins in the at least two excited slices and for generating spin echo signals ES after each multiband RF refocusing pulse follows from a multiband RF excitation pulse RF1. For clarity, FIG. 3 only shows four multiband RF refocusing pulses RF2. However, significantly more or also fewer multiband RF refocusing pulses RF2 can be included in the series. In principle, one multiband RF refocusing pulse RF2 is sufficient to generate one spin echo signal. Phase encoding gradients can be switched between the multiband RF refocusing pulses RF2 and the respectively generated spin echo signals ES for position encoding purposes. Since measures for spatial encoding are in principle known to the person skilled in the art, the phase encoding gradients have not been shown.

A flip angle that is smaller than 180° can be selected in each case for the multiband RF refocusing pulses RF2 so that e.g. a pseudo steady state is achieved in order to reduce a SAR load. In such cases not all multiband RF refocusing pulses RF2 need to generate the same flip angle, and instead e.g. the signal strength of the generated echo signals ES can be influenced as desired across various flip angles, such as e.g. described in the article by Hennig et al. cited above.

The first multiband RF refocusing pulse RF2 that follows from the multiband RF excitation pulse RF1 can have a larger flip angle than the following multiband RF refocusing pulses RF2, in order to facilitate a transient settling in the pseudo steady state. Such a procedure is indicated in FIG. 3 by the different amplitude of the multiband RF refocusing pulse RF2.

The spin echo signals ES generated are read out and stored in a read-out time R in each case.

A driven equilibrium module DE' is radiated after the last echo signal ES to be read out following on from a multiband RF excitation pulse RF1. In the example shown, the driven equilibrium module DE' comprises a multiband RF refocusing pulse DE-RF2, which acts in each case on precisely the same slices as the multiband RF excitation pulse RF1 that is radiated last and the multiband RF refocusing pulse RF2 that is radiated last.

The flip angle of the multiband RF refocusing pulse DE-RF2, about which the spins in the at least two excited slices will be flipped, can be selected such that a maximum refocusing of the magnetization of the spins in the at least two excited slices takes place, and a signal intensity of an echo signal ES generated after the last multiband RF refocusing pulse DE-RF2 of the driven equilibrium module DE' is thus optimized.

In such cases, the one multiband RF refocusing pulse DE-RF2 of the driven equilibrium module DE' can generate in particular a flip angle F2 of 90° plus the half flip angle F1 of the last preceding multiband RF refocusing pulse RF2 (F2=90°+F1/2). Such a choice of the flip angle of the one multiband RF refocusing pulse DE-RF2 of the driven equilibrium module DE' improves in particular an excursion from a pseudo ready state.

One example of gradients GR that can be switched in the read-out direction is additionally shown in the bottom line in FIG. 3. Besides the read-out gradients GR1 to be switched for the position encoding during a read-out time R, dephasing and rephasing gradients GR2 can also be switched in order to influence the respective phases of the spins to be manipulated. In particular prior to and/or after a multiband RF refocusing pulse DE-RF2 of the driven equilibrium module DE', at least one rephasing gradient GR2 can be switched in order to refocus the magnetization together with the multiband RF refocusing pulse DE-RF2 as optimally as possible.

As the last multiband RF pulse, the driven equilibrium module DE' comprises a multiband RF pulse DE-RF1 which flips the spins in the at least two excited slices about a small flip angle in the range of 60° to 120°. By this multiband RF pulse DE-RF1, the spins are realigned away from the transversal plane, e.g. in order to achieve as parallel or anti-parallel an orientation of the spins as possible in the direction of the main magnetic field (in the z-direction in FIG. 5).

If the multiband RF excitation pulse RF1 used generates a flip angle of 90°, it is expedient here to configure the multiband RF pulse DE-RF1 such that it flips the spins in the at least two excited slices about a flip angle which differs from 90°. A flip angle of less than 90° is recommended in order to achieve a resulting orientation of the spins in parallel to the main magnetic field. As a result, a T1 relaxation which has already occurred can be accommodated in the spin system. For example, a flip angle of greater than 90° can be chosen for an anti-parallel orientation for the multiband RF pulse DE-RF1, in order to compensate for a T1 relaxation which has already occurred.

If a multiband RF excitation pulse RF1 is used, which generates a flip angle of less than 90° in the spins of the at least two excited slices, e.g. in order to shorten the time required for a T1 relaxation already by the selected excitation flip angle, the flip angle of the last multiband RF pulse DE-RF1 of the driven equilibrium module DE' is to be adjusted accordingly. In general the flip angle of the multiband RF excitation pulse RF1 and the flip angle of the last multiband RF pulse DE-RF1 of the driven equilibrium module DE' can be adjusted to one another such that an optimal realignment of the spins is achieved in parallel or anti-parallel to the main magnetic field direction.

The last multiband RF pulse DE-RF1 of the driven equilibrium module DE' is radiated here during an echo signal. At this time as many spins as possible are refocused and can be realigned together. In the example shown in FIG. 3, the last multiband RF pulse DE-RF1 of the driven equilibrium module DE' is radiated at the time at which an echo signal ES' forms after the multiband RF refocusing pulse DE-RF2 of the driven equilibrium module DE' has been radiated.

Figure 4:
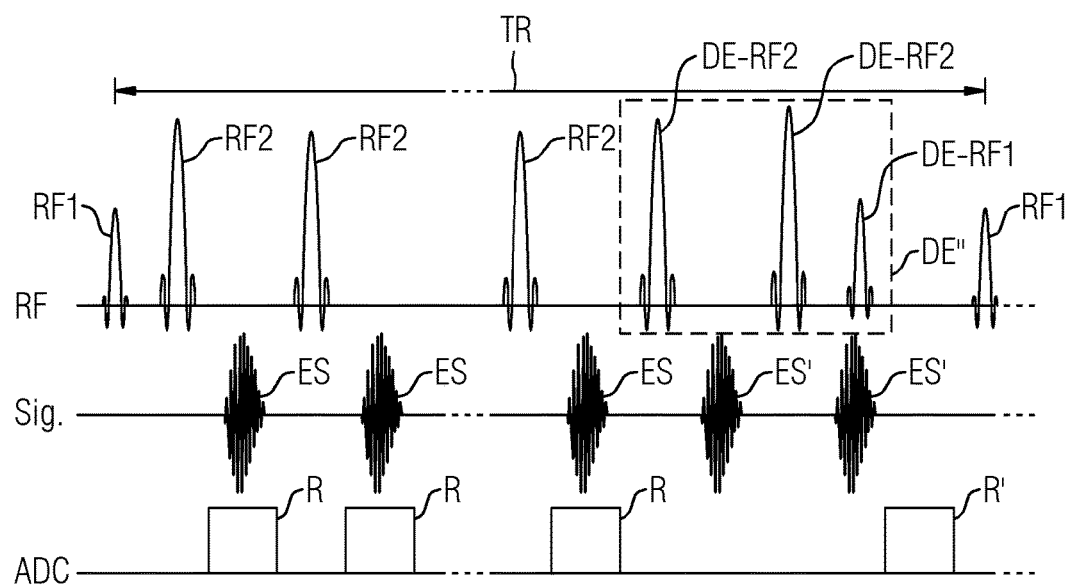
FIG. 4 shows a third schematic pulse sequence diagram, as can be used for the inventive method.

FIG. 4 shows a third schematic pulse sequence diagram, as can be used for the inventive method. Here the example shown in FIG. 4 differs from the example shown in FIG. 3 primarily by a driven equilibrium module DE" which is configured differently. In order to obtain space to represent the driven equilibrium module DE", the pulse sequence diagram in FIG. 4 has been shown in shortened form in the time between the multiband RF excitation pulse RF1 and the driven equilibrium module DE" (" . . . "). However the details set out in relation to FIGS. 2 and 3 apply analogously to this period of time.

A driven equilibrium module DE, DE', DE" can have at least one multiband RF refocusing pulse DE-RF2. In the example shown in FIG. 4, the driven equilibrium module DE" has two multiband RF refocusing pulses DE-RF2.

As explained in detail with regard to FIG. 3, the multiband RF refocusing pulses DE-RF2 included in the driven equilibrium module DE, DE', DE" can flip the spins in the at least two excited slices about in each case one flip angle, such that after the last multiband RF refocusing pulse DE-RF2 included in the driven equilibrium module DE, DE', DE", a maximum refocusing of the magnetization is carried out in the at least two excited slices in order to maximize an achievable signal intensity.

More flexibility is obtained in terms of optimizing the refocusing and the signal intensity by using a number of multiband RF refocusing pulses DE-RF2. An excursion from a pseudo steady state can be optimized in particular by a number of multiband RF refocusing pulses DE-RF2.

In such cases the flip angles generated by the multiband RF refocusing pulses DE-RF2 can be selected such that each subsequent multiband RF refocusing pulse DE-RF2 has a larger flip angle than a multiband RF refocusing pulse DE-RF2 played out immediately prior to the multiband RF refocusing pulse DE-RF2 or a multiband RF refocusing pulse RF2. This is shown schematically in FIG. 4 by the increasing amplitudes of the multiband RF refocusing pulses DE-RF2.

Here flip angles can be chosen according to the plan below in particular to optimize an excursion process from a pseudo steady state.

An angular increment x can be determined as a function of a flip angle F1 of the last multiband RF refocusing pulse RF2 radiated prior to the first multiband RF refocusing pulse DE-RF2 of the driven equilibrium module DE, DE', DE" and a selected number of multiband RF refocusing pulses DE-RF2, which are included in the driven equilibrium module DE, DE', DE", such that a first increment from the flip angle F1 of the last prior to the first multiband RF refocusing pulse DE-RF2 to the flip angle F2.1 of the first multiband RF refocusing pulse DE-RF2 and a last increment from the flip angle R2.n of the last multiband RF refocusing pulse DE-RF2 in the driven equilibrium module DE, DE', DE" at 180° is equal to the angular increment x, wherein n is the number of multiband RF refocusing pulses DE-RF2 in the driven equilibrium module DE, DE', DE". If applicable, further increments between the flip angle F2.1 of the i'th multiband RF refocusing pulse DE-RF2 and the flip angle F2.i+1 of the respective subsequent (i+1)'th multiband RF refocusing pulse DE-RF2 have a size of 2*x (i=1, . . . ,n). Such a choice of the flip angle of the multiband RF refocusing pulses DE-RF2 represents a particularly harmonic excursion from a pseudo steady state.

The following formula can be used to determine the angular increment x:

$$x = \frac{180° - F1}{2*n}.$$

For n=1 the flip angle of F2=F1+x=90°+F1/2 which has already been specified above in respect of FIG. 3 thus results for the one multiband RF refocusing pulse DE-RF2 of the driven equilibrium module DE, DE'.

For n=2 F2.1=F1+x and F2.2=F2.1+2*x=F1+3x result for the flip angles F2.1 and F2.2 of the multiband RF refocusing pulses DE-RF2 of the driven equilibrium module DE, DE".

For n=3 F2.1=F1+x, F2.2=F2.1+2*x=F1+3x and F2.3=F2.2+2*x=F1+5*x result for the flip angles F2.1, F2.2 and F2.3 of the multiband RF refocusing pulses DE-RF2 of the driven equilibrium module DE, DE".

For n>3 the flip angles F2.1 to F2.n of the multiband RF refocusing pulses DE-RF2 of the driven equilibrium module DE, DE" result analogously.

Like all driven equilibrium modules DE, DE', DE", in the driven equilibrium module DE" in FIG. 4 the last multiband RF pulse is a multiband RF pulse DE-RF1, which flips the spins in the at least two excited slices about a small flip angle in the range of 60° to 120° By this multiband RF pulse DE-RF1, the spins are realigned away from the transversal plane, e.g. in order to achieve as parallel or anti-parallel an orientation of the spins as possible in the direction of the main magnetic field (in the z-direction in FIG. 5). Otherwise the details set out in relation to this last multiband RF pulse DE-RF1, as described with respect to FIG. 3, apply to the embodiment of FIG. 4.

Also in driven equilibrium modules with more than one multiband RF refocusing pulse DE-RF2, as indicated in FIG. 3, at least one rephasing gradient GR2 can be switched prior to and/or after the multiband RF refocusing pulses DE-RF2 in order to refocus the magnetization together with the multiband RF refocusing pulse DE-RF2 as optimally as possible.

After the driven equilibrium module DE, DE', DE" has been radiated, further measurement signals can be read out and stored in a read-out time R'. These further measurement signals can be used in particular to determine and monitor noises and/or when determining rephasing gradients GR2 to be switched.

All RF pulses DE-RF1, DE-RF2 of the driven equilibrium module DE, DE', DE" in each case act on the same slices, in particular on the at least two slices that were excited last. As a result, the spins in the desired slices are each selectively manipulated and influences from spins lying outside of the desired slices are avoided.

It is also possible for the last multiband RF pulse DE-RF1 of the driven equilibrium module DE, DE', DE" to act on current slices that are slices on which the preceding multiband RF pulses of the driven equilibrium module acted, but the current slices can be larger than the previous slices, e.g. in order to reduce the effects of inhomogeneities in the slice profiles.

FIG. 5 schematically shows an inventive magnetic resonance system 1. This has a data acquisition scanner with a basic field magnet 3 that generates the constant basic magnetic field, a gradient coil arrangement 5 that generates the gradient fields, an RF antenna 7 that radiates and receives radio-frequency signals, and a control computer 9 designed to implement the inventive method. FIG. 5 schematically represents subassemblies of the magnetic resonance system 1 only roughly. The RF antenna 7 can be formed by at least two coils, like the coils 7.1 and 7.2 shown schematically, which can be designed either to only transmit radio-frequency signals, or to only receive the triggered radio-frequency signals, or for both.

To examine an examination object U, for example a patient or also a phantom, the examination object U can be introduced on a bed L into the measurement volume of the scanner. The slices Si and S2 represent examples of two different slices of the examination object, from which data can be acquired at the same time when recording MR signals.

The control computer 9 controls the magnetic resonance system 1 and can control the gradient coil arrangement 5 by means of a gradient controller 5', and the RF antenna 7 via an RF transmit/receive controller 7'. The RF antenna 7 can have a number of channels, in which signals can be individually transmitted or received.

The RF antenna 7, together with its RF transmit/receive controller 7', is responsible for generating and irradiating (transmitting) a radio-frequency alternating field for manipulating nuclear spins in an area to be manipulated (in particular in various slices S1 and S2) of the examination object U. In such cases the center frequency of the radio-frequency alternating field, which is also referred to as the B1 field, must be close to the resonance frequency of the spins to be manipulated. In order to generate the B1 field, currents are supplied to RF antenna 7 by the RF transmit/receive controller 7'. An inventive multiband RF pulse unit 7a, which may be included in the RF transmit/receive controller 7' for instance, calculates multiband RF pulses for manipulating various slices S1, S2 in the examination object U at the same time, as well as the multiband RF pulses of the driven equilibrium module, for reestablishing the longitudinal magnetization more quickly.

Furthermore, the control computer 9 has a separation processor 15 that separates simultaneously recorded measurement data from various slices and is designed to carry out the inventive method for generating measurement data of an examination object with the use of a slice multiplexing method, in which MR signals from at least two different slices of the examination object are detected at the same time as the MR signals are recorded, and a driven equilibrium module is used.

A core processor 13 of the control computer 9 is designed to execute all processing operations needed for the requisite measurements and determinations. Interim results and results required for this purpose or determined in this process can be stored in a memory M of the control computer 9. The units illustrated are not necessarily physically separate units, but merely represent a breakdown into functional units, which can be implemented in fewer units or in just a single physical unit.

Via an input/output device E/A of the magnetic resonance system 1, a user can route control commands to the magnetic resonance system 1 and/or results of the control computer 9, such as image data, can be displayed.

The method described herein can take the form of computer code that causes the control computer 9 to implement the method. The code is stored on an electronically readable data carrier 26 that is loaded into the control computer 9.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for generating magnetic resonance (MR) measurement data of an examination subject, said method comprising:
   (a) operating an MR data acquisition scanner to radiate a multiband radio-frequency (RF) excitation pulse into the examination subject that simultaneously selectively excites nuclear spins in at least two slices, which do not overlap in an examination region of the examination subject, thereby producing excited nuclear spins that produce a plurality of echo signals, including a last echo signal within a repetition;
   (b) operating the MR data acquisition scanner to readout said echo signals using at least two reception coils, and to store the readout echo signals in a measurement data record;
   (c) after reading out the last echo signal following said multiband RF excitation pulse, operating the MR data acquisition scanner to radiate a driven equilibrium module, comprising at least one further multiband RF pulse;
   (d) repeating (a) through (c) with at least one of different position encoding and excitation of different slices in respective repetitions, until all measurement data from said region are stored in said measurement data record; and
   (e) in a computer having access to said measurement data record, separating the measurement data contained in the measurement data record into individual slice specific measurement data records, respectively for said at least two slices, based on coil sensitivity data of said reception coils, and making the individual slice specific measurement data records available in electronic form from said computer.

2. A method as claimed in claim 1 comprising operating said MR data acquisition scanner, after radiating said multiband RF excitation pulse, to radiate at least one multiband RF refocusing pulse that refocuses the spins in said at least two slices, with said plurality of echo signals then being generated as spin echo signals after each radiated multiband RF refocusing pulse.

3. A method as claimed in claim 2 comprising radiating a series of at least two multiband refocusing pulses after radiating said multiband RF refocusing pulse, with each multiband RF refocusing pulse having a flip angle that is less than 180°.

4. A method as claimed in claim 1 comprising operating said MR data acquisition scanner to radiate said driven equilibrium module so as to include at least one multiband RF refocusing pulse.

5. A method as claimed in claim 4 comprising operating said MR data acquisition scanner to radiate said at least one multiband RF refocusing pulse in said driven equilibrium module so as to flip the spins in said at least two slices about one flip angle, respectively for each multiband RF refocusing pulse, in order to cause a maximum refocusing of magnetization of the spins in said at least two slices to occur after radiation of a last of said multiband refocusing pulses in said driven equilibrium module.

6. A method as claimed in claim 4 comprising operating said MR data acquisition scanner to activate at least one rephasing gradient either before or after a multiband RF refocusing pulse of said driven equilibrium module.

7. A method as claimed in claim 1 comprising operating said MR data acquisition scanner in order to radiate said driven equilibrium module with a plurality of further multiband RF pulses, with a last of said plurality of further multiband RF pulses flipping the spins in said at least two slices about a flip angle in a range between 60° and 120°.

8. A method as claimed in claim 1 comprising operating said MR data acquisition scanner in order to radiate said driven equilibrium module with a plurality of further multiband RF pulses, with a last of said plurality of further multiband RF pulses flipping the spins in said at least two slices about a flip angle that differs from 90°.

9. A method as claimed in claim 1 comprising operating said MR data acquisition scanner to radiate said driven equilibrium module with a plurality of further multiband RF pulses, and radiating a last of said further multiband RE pulses in said driven equilibrium module during an echo signal.

10. A method as claimed in claim 1 wherein said multiband RF excitation pulse has a flip angle, and comprising operating said MR data acquisition scanner to radiate said driven equilibrium module with a plurality of further multiband RE pulses, including a last further multiband RE pulse, and wherein said last further multiband RF pulse has a flip angle, and wherein said flip angle of said last multiband RF pulse and said flip angle of said multiband RF excitation pulse are adjusted relative to each other.

11. A method as claimed in claim 1 comprising operating said MR data acquisition scanner to readout and store said measurement signals after the driven equilibrium module is radiated.

12. A method as claimed in claim 1 comprising operating said MR data acquisition scanner to radiate said driven equilibrium module with a plurality of further multiband RE pulses, with all of said further multiband RF pulses in said driven equilibrium module acting on same slices in said region.

13. A method as claimed in claim 1 comprising operating sad MR data acquisition scanner to radiate said driven equilibrium module with a plurality of further multiband RE pulses, including a last further multiband RF pulse, and wherein said last multiband RF pulse of said driven equilibrium module acts on slices in said region that include slices acted on by further multiband RF pulses of the driven equilibrium module in a preceding repetition.

14. A magnetic resonance (MR) apparatus comprising:
an MR data acquisition scanner;
a computer configured to operate the MR data acquisition scanner to (a) radiate a multiband radio-frequency (RF) excitation pulse into an examination subject that simultaneously selectively excites nuclear spins in at least two slices, which do not overlap in an examination region of the examination subject, thereby producing excited nuclear spins that produce a plurality of echo signals, including a last echo signal within a repetition;
said computer configured to operate the MR data acquisition scanner to (b) readout said echo signals using at least two reception coils, and to store the readout echo signals in a measurement data record;
said computer configured to (c) after reading out the last echo signal following said multiband RF excitation pulse, operate the MR data acquisition scanner to radiate a driven equilibrium module, comprising at least one further multiband RF pulse;
said computer configured to (d) repeat (a) through (c) with at least one of different position encoding and excitation of different slices in respective repetitions, until all measurement data from said region are stored in said measurement data record; and
said computer configured to (e) separate the measurement data contained in the measurement data record into individual slice-specific measurement data records, respectively for said at least two slices, based on coil sensitivity data of said reception coils, and make the individual slice-specific measurement data records available in electronic form from said computer.

15. A non-transitory, computer-readable data storage medium encoded with programming instructions, said storage medium being loaded into a computer system of a magnetic resonance (MR) apparatus comprising an MR data acquisition scanner, said programming instructions causing said computer system to:
(a) operate said MR data acquisition scanner to radiate a multiband radio-frequency (RF) excitation pulse into an examination subject that simultaneously selectively excites nuclear spins in at least two slices, which do not overlap in an examination region of the examination subject, thereby producing excited nuclear spins that produce a plurality of echo signals, including a last echo signal within a repetition;
(b) operate the MR data acquisition scanner to readout said echo signals using at least two reception coils, and to store the readout echo signals in a measurement data record;
(c) after reading out the last echo signal following said multiband RF excitation pulse, operate the MR data acquisition scanner to radiate a driven equilibrium module, comprising at least one further multiband RF pulse;
(d) repeat (a) through (c) with at least one of different position encoding and excitation of different slices in respective repetitions, until all measurement data from said region are stored in said measurement data record; and
(e) separate the measurement data contained in the measurement data record into individual slice-specific measurement data records, respectively far said at least two slices, based on coil sensitivity data of said reception coils, and make the individual slice-specific measurement data records available in electronic form from said computer.

* * * * *